US 8,484,527 B2

(12) United States Patent
Tang et al.

(10) Patent No.: US 8,484,527 B2
(45) Date of Patent: *Jul. 9, 2013

(54) SYSTEMS AND METHODS FOR ACHIEVING HIGHER CODING RATE USING PARITY INTERLEAVING

(75) Inventors: Heng Tang, Sunnyvale, CA (US); Gregory Burd, San Jose, CA (US); Zining Wu, Los Altos, CA (US); Panu Chaichanavong, Mountain View, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/536,522

(22) Filed: Jun. 28, 2012

(65) Prior Publication Data

US 2012/0278686 A1 Nov. 1, 2012

Related U.S. Application Data

(63) Continuation of application No. 13/112,915, filed on May 20, 2011, now Pat. No. 8,225,148, which is a continuation of application No. 11/589,532, filed on Oct. 30, 2006, now Pat. No. 7,962,827.

(60) Provisional application No. 60/793,119, filed on Apr. 19, 2006, provisional application No. 60/780,416, filed on Mar. 8, 2006.

(51) Int. Cl.
*H03M 13/00* (2006.01)

(52) U.S. Cl.
USPC .......................................................... 714/755

(58) Field of Classification Search
USPC .......................... 714/701, 704, 752, 755, 784
See application file for complete search history.

(56) References Cited

U.S. PATENT DOCUMENTS

| | | | |
|---|---|---|---|
| 5,068,858 A * | 11/1991 | Blaum et al. | 714/774 |
| 5,220,568 A * | 6/1993 | Howe et al. | 714/782 |
| 5,469,448 A | 11/1995 | Denissen et al. | |
| 6,631,490 B2 | 10/2003 | Shimoda | |

(Continued)

FOREIGN PATENT DOCUMENTS

WO       WO 01/67477       9/2001

OTHER PUBLICATIONS

Bliss, "Circuitry for Performing Error Correction Calculations on Baseband Encoded Data to Eliminate Error Propagation," IBM Tech Disclosure Bulletin, vol. 23, No. 10, Mar. 1981.

(Continued)

*Primary Examiner* — Shelly A Chase

(57) ABSTRACT

The disclosed technology provides systems and methods for encoding data based on a run-length-limited code and an error correction code to provide codewords. The codewords include RLL-encoded data that are produced based on the RLL code, and parity information that are produced based on the error correction code. The parity information is interleaved among the RLL-encoded data. In one embodiment, the codeword is produced by separately producing the RLL-encoded data and the parity information, and interleaving the parity information among the RLL-encoded data. In one embodiment, the codeword is produced by producing the RLL-encoded data, and using erasure decoding to compute the parity information.

20 Claims, 17 Drawing Sheets

U.S. PATENT DOCUMENTS

| | | | |
|---|---|---|---|
| 6,954,885 B2 | 10/2005 | Hurt et al. | |
| 7,030,789 B1 | 4/2006 | Cideciyan et al. | |
| 7,100,101 B1 | 8/2006 | Hemphill et al. | |
| 7,174,485 B2 | 2/2007 | Silvus | |
| 7,221,633 B2 * | 5/2007 | Yamaguchi et al. | 369/53.22 |
| 7,268,707 B2 | 9/2007 | Takashi et al. | |
| 7,290,184 B2 | 10/2007 | Bruner et al. | |
| 7,603,608 B2 | 10/2009 | Kondou et al. | |

OTHER PUBLICATIONS

Lin et al., Combined ECC and RLL codes, Nov. 1988, IEEE Trans on Magnetics, vol. 24, No. 6 pp. 2527-2528.

Kunisa, "Runlength Control Based on Guided Scrambling for Digital Magnetic Recording," IEICE Trans. Electron, vol. E82-C, No. 12, Dec. 1999, pp. 2209-2217.

* cited by examiner

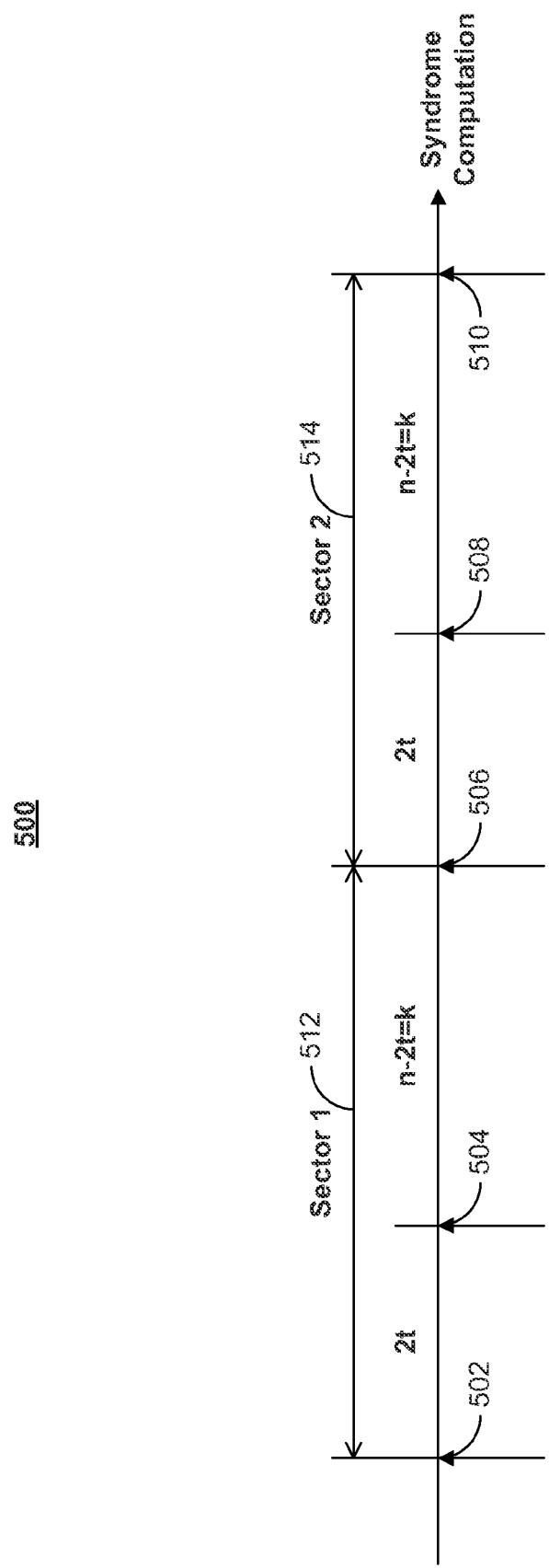

SYSTEMS AND METHODS FOR ACHIEVING HIGHER CODING RATE USING PARITY INTERLEAVING

CROSS-REFERENCE TO RELATED APPLICATIONS

This application is a continuation of U.S. application Ser. No. 13/112,915, filed May 20, 2011, which is a continuation of U.S. application Ser. No. 11/589,532, filed Oct. 30, 2006, which claims the benefit under 35 U.S.C. §119(e) of U.S. Provisional Application No. 60/780,416, filed on Mar. 8, 2006, and of U.S. Provisional Application No. 60/793,119, filed on Apr. 19, 2006, the contents of all of which are hereby incorporated by reference herein in their entirety.

BACKGROUND OF THE INVENTION

Embodiments of the invention generally pertain to systems and methods for processing and coding data. In particular, embodiments of the invention pertain to systems and methods for encoding and decoding data.

Different codes can be used to encode data to achieve different results. One class of codes, called constrained codes, can be used to eliminate undesirable data patterns. A particular type of constrained codes, called run-length limited (RLL) codes, can be used to guarantee maximum and/or minimum transition spacing. RLL codes can be enhanced to provide DC-limited constraint in addition to run-length limited constraint. RLL codes are widely used in non-volatile storage drives, such as hard disk drives and digital optical discs, to prevent long stretches of no transitions, thus ensuring reliable timing information is available to the detector.

Another class of codes, called error-correcting codes (ECC), may be used to detect and/or correct errors. Error correcting codes are often used to correct errors which may occur during transmission or storage. Errors may occur for a number of reasons, including, for example, noise or interference, scratches on a CD, and/or other reasons. One type of ECC is known in the art as a Reed-Solomon (RS) code. A Reed-Solomon encoder receives original data and produces "redundant" or "parity" data based on the original data. The combination of the original data and the parity data is called a Reed-Solomon codeword. A RS codeword can be stored and/or communicated, during which errors may occur in the codeword, as described above. A Reed-Solomon decoder can process an erroneous version of a RS codeword to attempt to correct the errors and recover the original data.

Following the RS ECC encoder, the portion of RS ECC codeword that contains user data still satisfies the RLL constraint (if a systematic RS ECC encoder is used). However, the parity portion of RS ECC codeword might not have any RLL constraint. This in turn can present a problem on the decoder side: insufficient timing information and presence of catastrophic sequences in the RS parity portion can degrade detector performance. To avoid this difficulty, RS ECC redundancy has traditionally been encoded with another RLL code. The second RLL code has a much lower code rate, and is commonly referred to as a Low Rate RLL (LR RLL). Low rate RLL is used for RS ECC redundancy encoding because, on the decoder side, LR RLL has to be decoded prior to RS ECC decoder. Consequently LR RLL code can not have much error propagation, which dictates the use of low rate codes. In contrast, HR RLL code is decoded following the RS ECC decoder, and at this point either there are no errors (RS ECC was able to recover transmitted data) and so the error propagation of HR RLL is not an issue, or RS ECC failed and the sector must be re-transmitted.

There is a continuous interest in improving format efficiency by reducing the overhead of various codes used in the system.

SUMMARY OF THE INVENTION

Disclosed herein are systems and methods for encoding data, including encoding data based on a run length limited (RLL) code to provide RLL-encoded data. The RLL code may be high rate (HR) RLL code. A copy of the RLL-encoded data may be stored in a buffer. The RLL-encoded data can then be encoded based on an error correction code to provide parity information. The error correction code can be a Reed-Solomon code, a Maximum Distance Separable code, a BCH (Bose, Ray-Chaudhuri, Hocquenghem) code or any other error correction code. In order to avoid using LR RLL code, the parity information can be interleaved with the RLL-encoded data in the buffer to provide interleaved data. In one embodiment, the interleaved data is stored in non-volatile storage. Interleaving RS ECC parity with the HR RLL encoded data may degrade the RLL constraint imposed by the HR RLL code, but it would not destroy it completely.

A communicated version of the interleaved data may be accessed and decoded. As used herein, a "communicated version" of interleaved data includes interleaved data that has been stored on a storage device. Decoding may include parsing the communicated version of the interleaved encoded data to separate the parity information from the RLL-encoded data, which may be HR RLL-encoded data. The RLL-encoded data may then be stored in a data buffer while the parity information is stored in a parity buffer. Syndrome computation may be performed on the data in the buffers. According to one embodiment, the data buffer and the parity buffer are first-in-first-out (FIFO) buffers.

According to one aspect, the invention provides alternative systems and methods for encoding data. The data may be encoded with a RLL code to provide RLL-encoded data. The RLL code may be a high rate RLL code. The RLL-encoded data may then be stored at designated portions in a memory, and the designated positions in the memory may be separated by empty portions designated as erasure portions. Instead of inserting ECC parity at the end of the codeword, parity positions may be spread throughout the data. One approach to carrying out such an encoder is via an error-and-erasure decoder. To this end, symbols in the designated parity positions are marked as erasures. Erasure decoding may then be performed on the data in the memory to determine parity symbols for the erasure portions. The parity symbols may be stored in the erasure portions in the memory to provide interleaved data.

The interleaved data may comprise one or more Reed-Solomon codewords, and it may be DC-free. In one embodiment, the interleaved data is stored in non-volatile storage.

In another aspect, the invention provides an alternative method for encoding data, including encoding data based on a first code to provide primary encoded data. The first code may be a convolutional code, a block code, or any other code. A copy of the primary encoded data may then be stored in a buffer. The primary encoded data can then be encoded based on a systematic code to provide parity information. The systematic code may be a BCH code. The parity information can be interleaved with the stored primary encoded data to provide interleaved data.

In another aspect, the invention provides a method for encoding data including segmenting the data into first and second portions. The first portion may then be encoded based on a run length limited (RLL) code to provide RLL-encoded data. A copy of the RLL-encoded data and the second portion may be stored in buffer. The stored data may then be encoded based on an error correction code to provide parity information. The parity information and the second portion may then be interleaved with the stored RLL-encoded data to provide interleaved data.

In another aspect, the invention provides a system for encoding data, including a RLL encoder, a buffer, an error correction coding (ECC) encoder, and logic. The RLL-encoder may encode data based on a RLL) code to provide RLL-encoded data, and the buffer may store a copy of the RLL-encoded data. The RLL code may be a high rate RLL code. The ECC-encoder may encode the RLL-encoded data based on an ECC code and provide parity information. In various embodiments, the ECC code may be a Maximum Distance Separable code, and it may be a Reed-Solomon code. The logic may interleave the parity information with the RLL-encoded data to produce interleaved data. The logic may comprise a multiplexer. The interleaved data may be DC-free. The system may also include a non-volatile storage for storing the interleaved data.

In some embodiments, the system includes an input and a decoder. The input may access a communicated version of the interleaved data. The decoder decodes the communicated version of the interleaved data and may include a parser, a data buffer, a parity buffer and a processor. The parser parses the communicated version of the interleaved encoded data to separate the parity information from the RLL-encoded data. The data buffer stores the RLL-encoded data, and the parity buffer stores the parity information. The buffers may be first-in-first out (FIFO) buffers. The processor may perform syndrome computation on the buffered data.

In another aspect, the invention provides a system for encoding data, including a RLL encoder, a memory, and an erasure decoder. The RLL-encoder may encode data based on a run length limited (RLL) code to provide RLL-encoded data. The RLL code may be a high rate RLL code. The memory may store the RLL-encoded data, and in particular, may store the RLL-encoded data at designated positions in the memory, such that the designated portions are separated by empty portions designated as erasure portions. The erasure decoder may perform erasure decoding on the data in the memory to determine parity symbols for the erasure portions of the memory and to provide interleaved data. The interleaved data may include one or more Reed-Solomon codewords, and it may be DC-free. The system may also include a non-volatile storage for storing the interleaved data.

In another aspect, the invention provides a system for encoding data, including a first encoder, a buffer, a second encoder, and logic. The first encoder may encode data based on a first code to provide primary encoded data, and the buffer may store a copy of the primary encoded data. A second encoder may encode the primary encoded data based on a systematic code to provide parity information. Logic may then interleave the parity information with the primary encoded data to produce interleaved data. The logic may include a multiplexer.

In a further aspect, the invention provides a system for encoding data, including a parser, a run length limited encoder, a buffer, an error correction coding encoder, and logic. The parser may segment the data into first and second portions. The run length limited encoder may then encode a first portion of the data based on a run length limited (RLL) code to provide RLL-encoded data. The RLL-encoded data and the second portion may be stored in a buffer. An error correction coding encoder may then encode the RLL-encoded data and the second portion based on an error correction code to provide parity information. Logic may interleave the parity information and the second portion with the RLL-encoded data to produce interleaved data.

According to one aspect, the invention includes means for encoding data, including means for encoding data based on a run length limited (RLL) code, means for storing data, means for encoding data based on an error correction coding (ECC) code, and means for interleaving data. The means for encoding data based on a RLL code to provide RLL-encoded data. The RLL code may be high rate (HR) RLL code. The system may provide means for storing the RLL-encoded data. The means for encoding data based on ECC code may include means for providing parity information. The interleaving means may interleave the parity information with the RLL-encoded data to produce interleaved data. The system may also include non-volatile means for storing the interleaved data.

In some embodiments, the system may include means for accessing the interleave data and means for decoding the interleaved data. The decoding means may include means for parsing the communicated version of the interleaved encoded data to separate the parity information from the RLL-encoded data, which may be HR RLL-encoded data. A storage means may be provided for storing the RLL-encoded data while a second storage means may be provided for storing the parity information. Means may be provided for performing syndrome computation on the data in the storage means. According to one embodiment, the storage means are first-in-first-out (FIFO) buffers.

According to another aspect, the invention provides alternative means for encoding data with a RLL code to provide RLL-encoded data. The RLL code may be a high rate RLL code. Means may be provided for storing the RLL-encoded data at designated portions in a memory, and the designated positions in the memory may be separated by empty portions designated as erasure portions. Means may be provided for spreading the parity positions throughout the data. One encoding means may include an error-and-erasure decoding means. The error-and-erasure decoding means may mark symbols in the designated parity positions as erasures. Erasure decoding means may then be provided for performing erasure decoding on the data in the memory to determine parity symbols for the erasure portions. Means may be provided for storing the parity symbols in the erasure portions in the memory to provide interleaved data.

The interleaved data may comprise one or more Reed-Solomon codewords, and it may be DC-free. In one embodiment, storage means are provided for storing the interleaved data in non-volatile storage.

In a further aspect, the invention provides another means for encoding data, including means for encoding data based on a first code to provide primary encoded data. The first code may be a convolutional code, a block code, or any other code. Storage means may be provided for storing a copy of the primary encoded data. A second encoding means may be provided for encoding the primary encoded data based on a systematic code to provide parity information. The systematic code may be a BCH code. Interleaving means may be provided for interleaving the parity information with the stored primary encoded data to provide interleaved data.

In another aspect, the invention provides a further means for encoding data including means for segmenting the data into first and second portions. Encoding means may be provided for encoding the first portion based on a run length limited (RLL) code to provide RLL-encoded data. Storage means may also be included for storing a copy of the RLL-encoded data and the second portion. An ECC encoding means may be provided for encoding the stored data based on an error correction code to provide parity information. An interleaving means may be provided for interleaving the parity information and the second portion with the stored RLL-encoded data to provide interleaved data.

One aspect of the invention may include a computer program comprising instructions for execution on a computer to encode data based on a run length limited (RLL) code to provide RLL-encoded data. The RLL code may be high rate (HR) RLL code. The program may include instructions for storing a copy of the RLL-encoded data in a buffer. The program may also include instructions for encoding the RLL-encoded data based on an error correction code to provide parity information. The error correction code can be a Reed-Solomon code, a Maximum Distance Separable code, a BCH (Bose, Ray-Chaudhuri, Hocquenghem) code or any other error correction code. In order to avoid using LR RLL code, the program also includes instructions for interleaving the parity information with the RLL-encoded data in the buffer to provide interleaved data. In one embodiment, the program includes instructions for storing the interleaved data in non-volatile storage.

The computer program may also include instructions for accessing and decoding a communicated version of the interleaved data. The instructions for decoding may include instructions for parsing the communicated version of the interleaved encoded data to separate the parity information from the RLL-encoded data, which may be HR RLL-encoded data. The program may also include instructions for storing the RLL-encoded data in a data buffer and instructions for storing the parity information in a parity buffer. The program may include instructions for performing syndrome computation on the data in the buffers.

According to one aspect, the invention provides alternative computer program instructions for encoding data. The program may provide instructions for encoding data with a RLL code to provide RLL-encoded data. The RLL code may be a high rate RLL code. Instructions may be provided for storing the RLL-encoded data at designated portions in a memory, and for separating the designated positions in the memory by empty portions designated as erasure portions. Instead of inserting ECC parity at the end of the codeword, parity positions may be spread throughout the data. The program may include instructions for encoding the data via instructions for error-and-erasure decoding. To this end, instructions may be provided for marking symbols in the designated parity positions as erasures, and then for performing erasure decoding on the data in the memory to determine parity symbols for the erasure portions. The program may include instructions for storing the parity symbols in the erasure portions in the memory to provide interleaved data. Instructions may also be provided for storing the interleaved data in non-volatile storage.

In a further aspect, the invention provides computer program instructions for encoding data, including instructions for encoding data based on a first code to provide primary encoded data. The first code may be a convolutional code, a block code, or any other code. Instructions may be provided for storing a copy of the primary encoded data in a buffer. Instructions may also be provided for encoding the primary encoded data based on a systematic code to provide parity information. The systematic code may be a BCH code. The program may also include instructions for interleaving the parity information with the stored primary encoded data to provide interleaved data.

In another aspect, the invention provides a further computer programs including instructions for encoding data including instructions for segmenting the data into first and second portions. The program may include instructions for encoding the first portion based on a run length limited (RLL) code to provide RLL-encoded data. Instructions may be provided for storing a copy of the RLL-encoded data and the second portion in a buffer. The program may include instructions for encoding the stored data based on an error correction code to provide parity information. Instructions may also be included for interleaving the parity information and the second portion with the stored RLL-encoded data to provide interleaved data.

Further features of the invention, its nature and various advantages, will be more apparent from the accompanying drawings and the following detailed description of the various embodiments.

BRIEF DESCRIPTION OF THE DRAWINGS

FIG. 2A is a block diagram illustrating an exemplary codeword following ECC-encoding;

FIG. 2B is a block diagram illustrating an exemplary interleaved codeword in accordance with one aspect of the invention;

FIG. 5 is a block diagram illustrating an exemplary timing diagram for performing syndrome computation in connection with decoding a Reed-Solomon codeword;

DETAILED DESCRIPTION

The systems and methods of this invention generally relate to detecting and/or correcting errors associated with the communication and/or storage of data. In general, and as will be discussed in more detail below, a "channel" refers to a medium on which a data-bearing signal is communicated and/or stored, as well as events that may physically affect the medium. Various aspects of a channel may corrupt data that is communicated or stored thereon, and the data recovered subsequent to communication or storage may be different from their intended values. Such differences are referred to herein as "errors." The systems and methods described herein employ data encoding and decoding to mitigate the occurrences of errors in data. "Encoding" generally refers to the process of generating data in a manner that facilitates subsequent detection and/or correction of errors in the data, and "decoding" generally refers to the counterpart process of detecting and/or correcting the errors.

Figure 1:
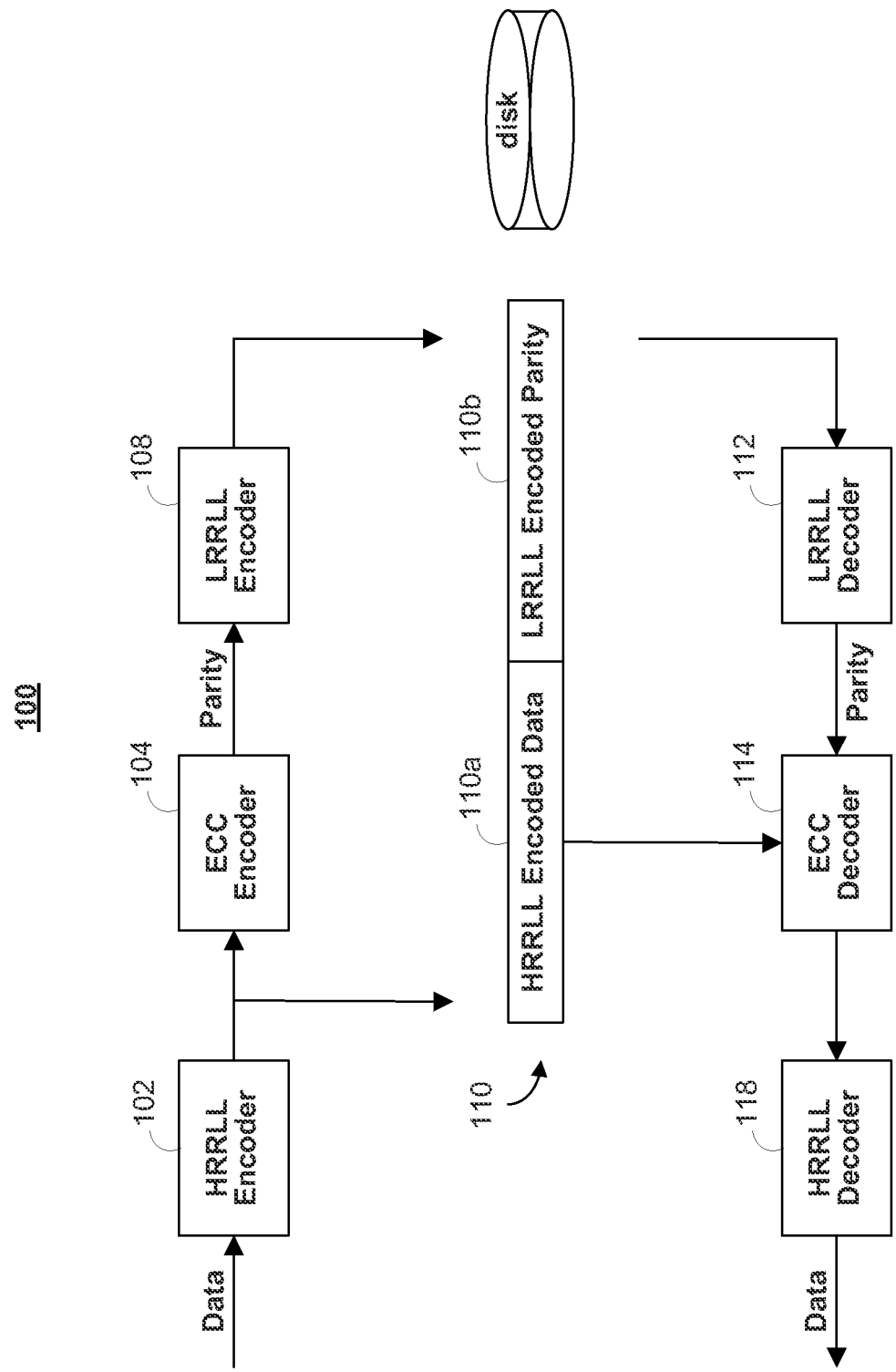
FIG. 1 is a block diagram of a prior art system for encoding data.

FIG. 1 is a block diagram of a prior art system 100 for encoding and decoding data. The data may be in the form of binary digits, or bits, suitable for input to an encoder, or it may be grouped into m-bit symbols (where m is an integer). In the illustrated system 100, data is first received by a high rate run length limited (HRRLL) encoder 102, which produces HRRLL-encoded data. Run length limited (RLL) encoding prevents long stretches of data with no transitions in bit value, which can be undesirable for various reasons. High rate RLL encoding, as used herein, refers to producing encoded data with a higher data rate, i.e., a higher ratio of original data to original plus parity data. The term "data rate" refers to the ratio of original data to original data plus parity data. The HRRLL-encoded data is sent to an error-correction code (ECC) encoder 104, and a copy of the HRRLL-encoded data is stored in a buffer 110. The ECC encoder 104 computes parity information based on the HRRLL-encoded data, and sends the parity information to a low-rate RLL (LRRLL) encoder 108, which produces LRRLL encoded data based on the parity information. LRRLL encoding produces encoded data with a lower data rate, and, therefore, has the ability to achieve a lower error propagation compared to HRRLL encoding. As used herein, the terms "high rate" and "low rate" are used relative to each other, such that "high rate" simply refers to a higher data rate than "low rate." For example, in various embodiments, LRRLL codes may have a data rate that is between about $5/6$ and about $63/64$, and HRRLL-codes may have a rate that is about an order of magnitude higher than the LRRLL codes, such as a data rate that is between about $63/64$ and about $255/256$, for example.

In the illustrated system 100, the parity information produced by the ECC-encoder 104 will later be used as part of detecting and/or correcting errors that may occur during communication or storage. Therefore, the parity information is encoded by a LRRLL encoder 108 to achieve RLL constraint in the RS ECC redundancy portion of the codeword. The LRRLL-encoded parity information is appended to the HRRLL-encoded data in the buffer 110. The encoded data in the buffer 110 may then be stored in a storage device for later retrieval (as shown) and/or communicated to another system via a channel (not shown).

To recover the original data, the stored/communicated encoded data can be decoded. The LRRLL-encoded parity information portion 110b of the data is sent to a LRRLL-decoder 112, which produces the possibly corrupted original parity information and communicates it to an ECC-decoder 114. The ECC-decoder 114 also receives as input a possibly corrupted copy of the original HRRLL-encoded data 110a. Based on the HRRLL encoded data 110a and the parity information, the ECC-decoder 114 can attempt to correct errors that may exist in the input HRRLL-encoded data 110a. Ideally, the ECC decoder 114 is able to correct the errors, and the output of the ECC decoder 114 would be the same as the output of the HRRLL encoder 102. The output of the ECC decoder 114 is received by the HRRLL-decoder 118, which decodes the HRRLL-encoded data and outputs a copy of the original data.

As described above herein, one type of error-correction code is a Reed-Solomon code. A Reed-Solomon encoder takes original, digital data and produces extra "redundant" bits based on the original data. A Reed-Solomon decoder processes each block and attempts to correct errors in the received data using the redundant bits and thus to recover the original data. The number and type of errors that can be corrected depends on the characteristics of the particular Reed-Solomon code.

In general, a Reed-Solomon (RS) encoder outputs a codeword comprising a block of n m-bit symbols (where n and m are integers). The symbols include k data symbols and (n−k) parity symbols. Thus, a RS encoder takes k data symbols and adds (n−k) parity symbols to result in an n symbol codeword. A Reed-Solomon decoder can correct up to t symbols (where t is an integer) that contain errors in a codeword, where t=(n−k)/2. Furthermore, a Reed-Solomon decoder can correct up to 2t unknown symbols or "erasures" in a codeword.

The present invention describes more efficient systems and methods for encoding and decoding data than that described with respect to the prior art system of FIG. 1. In one aspect of the invention, the present invention eliminates LRRLL-encoding, thus improving system code rate. Code rate is defined as the ratio of the original user data to the user data plus the added redundancy. Additionally, if HRRLL has the DC-free feature, the code rate of the LRRLL may be further decreased (compared to currently-used LRRLL code rates) for the new LRRLL to have the same feature. Therefore, in the DC-free system, eliminating LRRLL-encoding helps to maintain an acceptable code rate. The present invention includes techniques other than a DC-free LRRLL to maintain the DC-free property of the data. DC-free codes limit low frequency content and thus can reduce baseline wander.

Figures 2A, 2B:
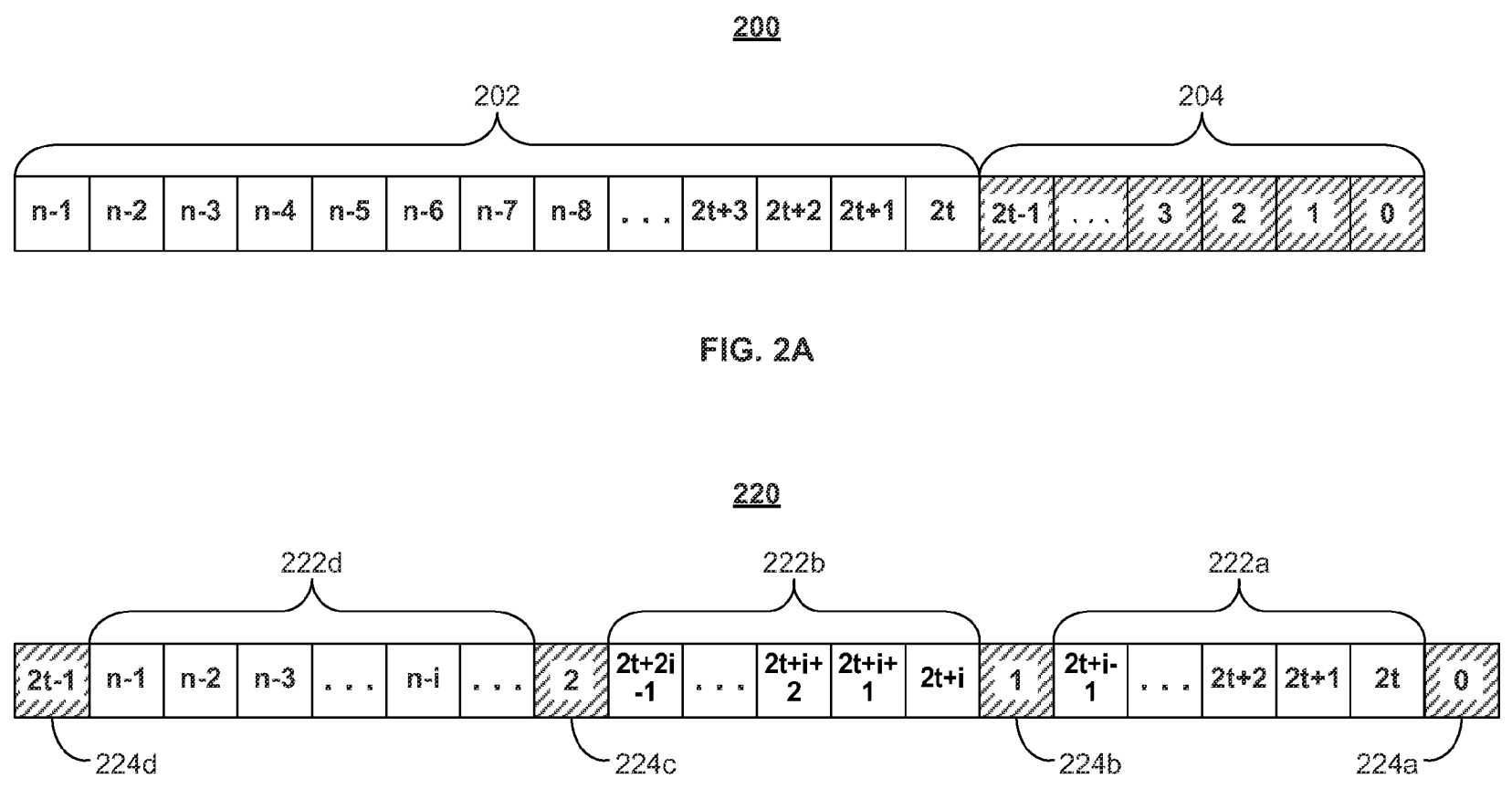

Referring now to FIG. 2A, there is shown a block diagram illustrating an exemplary codeword 200 following ECC-encoding. According to one aspect of the invention, the first codeword portion 202 can be the output of the HRRLL encoder 102 of FIG. 1, and the second codeword portion 204 can be the parity information produced by the ECC encoder 104 of FIG. 1. However, the parity symbols 204 of the codeword 200 are not LRRLL-encoded. In one embodiment, if the ECC encoder 104 is a Reed-Solomon encoder, the codeword 200 has n−2t data symbols 202 of HRRLL-encoded data, and 2t parity symbols 204 of parity information. The entire codeword 200 can be referred to as a Reed-Solomon codeword. The illustrated Reed-Solomon codeword is exemplary, and other error-correction codes can also be used. Additionally, the HRRLL-encoded data can be encoded based on a RLL code having a suitable rate. The RLL code need not be a "high rate" RLL code.

Since the parity information 204 is not encoded based on a LRRLL code, the parity information 204 is not run-length limited and may also be more susceptible to error propagation. According to one aspect of the present invention, the parity symbols 204 can be interleaved into the RLL-encoded symbols 202. FIG. 2B is a block diagram illustrating the exemplary codeword 220 following interleaving of the parity information into the RLL-encoded symbols. The codeword 220 of FIG. 2B will be referred to herein as an "interleaved codeword." In one embodiment, the parity symbols can be interleaved uniformly among the RLL-encoded symbols at evenly-spaced intervals. Because the parity information is uniformly interleaved among the RLL-encoded symbols, the interleaved codeword 220 is essentially also run-length limited. Continuing with the previous example of an RS codeword, the interleaved codeword 220 of FIG. 2B includes n−2t data symbols of HRRLL-encoded data divided into 2t−1 data portions 222a-222d. The codeword 220 also includes 2t parity symbols 224a-224d of parity information. The parity symbols 224a-224d are interleaved into the data symbol portions with a period i (where i may be any integer). Thus, the codeword 220 begins with a parity symbol 224a, followed by i−1 data symbols 222a, then a second parity symbol 224b, followed by i−1 data symbols 222b, and so forth. Note that while the codeword 220 begins with a parity symbol 224a, in other embodiments, the codeword 220 may begin with data symbols, with parity symbols interleaved thereafter. In the illustrative example, the codeword 220 also ends with a parity symbol 224d. However, in some embodiments, and depending on the selected value of the period i, the codeword 220 may end with data symbols.

Figure 3A:
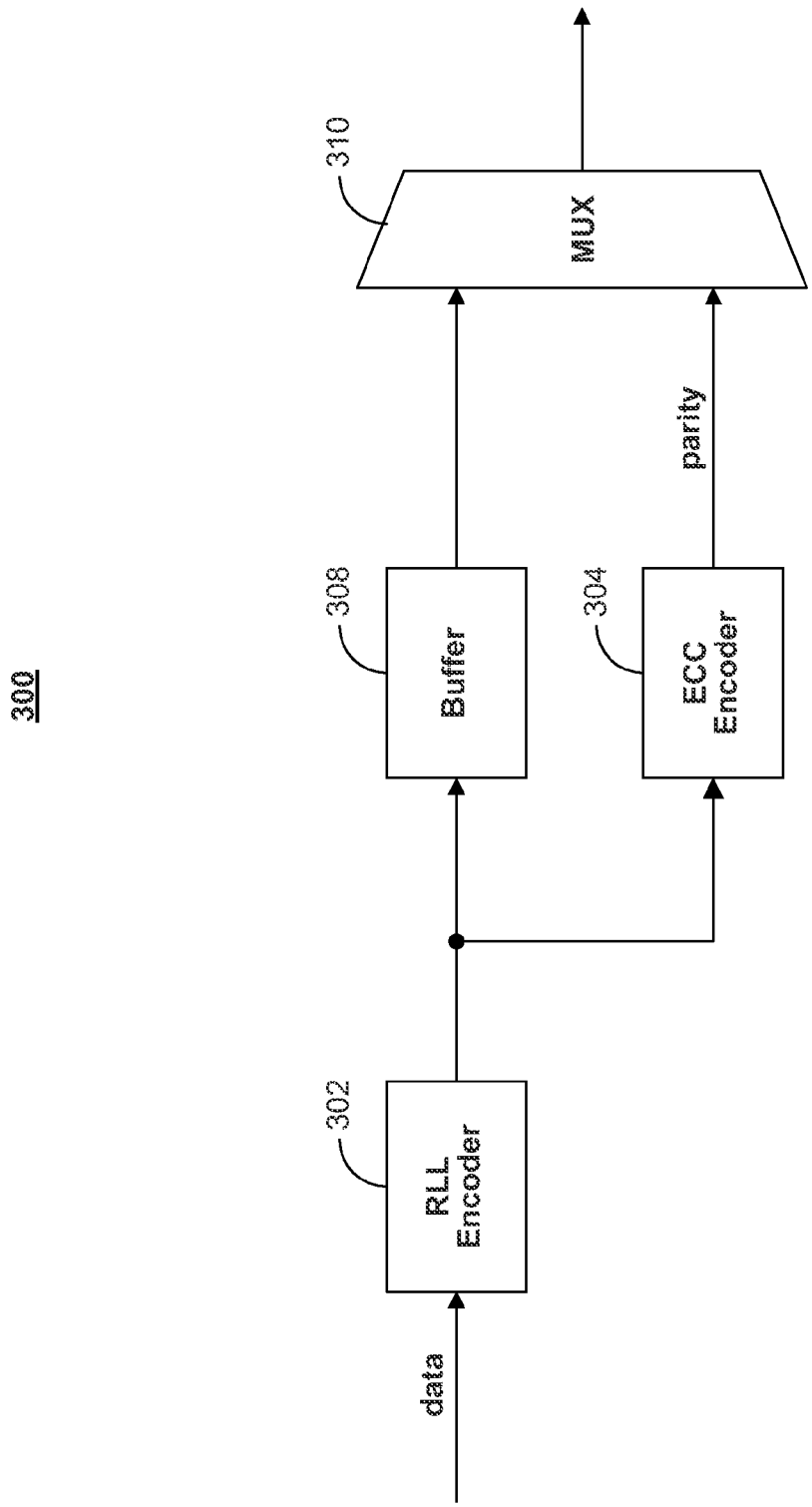
FIG. 3A is a block diagram of an exemplary system for producing the interleaved codeword of FIG. 2B.
Figure 3B:
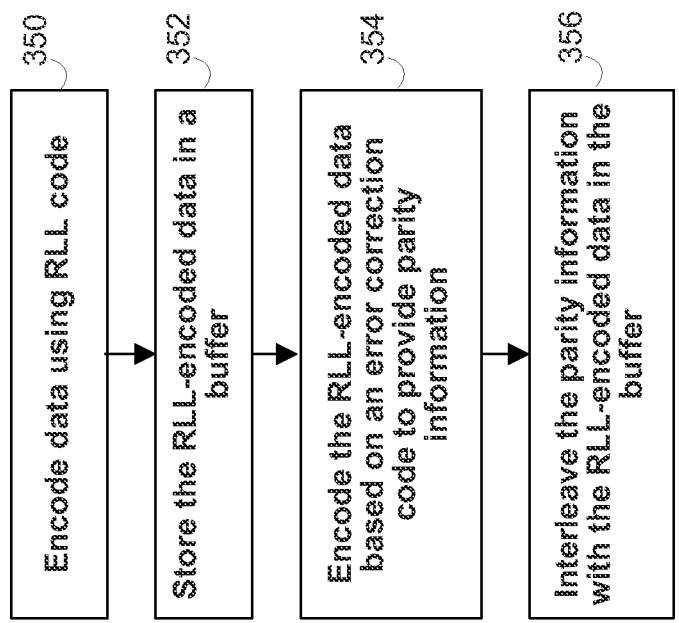
FIG. 3B is a flow diagram of an exemplary method producing the interleaved codeword of FIG. 2B.

In accordance with one aspect of the invention, FIGS. 3A and 3B are diagrams of a system and corresponding method for producing an interleaved codeword, such as the codeword 220 of FIG. 2B. Referring now to FIG. 3A, data is received by a RLL-encoder 302, which produces RLL-encoded data based on the received data. In one embodiment, the RLL-encoding may be "high-rate" RLL encoding. The meaning of "high-rate" may vary for different applications. The RLL-encoded data is stored in a buffer 308, while a copy of the RLL-encoded data is sent to an ECC-encoder 304. The ECC-encoder 304 further encodes the RLL-encoded data based on an error correction code to produce parity information. Next, both the RLL-encoded data stored in the buffer 308 and the parity information provided by the ECC-encoder 304 are sent to a multiplexer 310. The multiplexer 310 interleaves the parity information with the RLL-encoded data from the buffer 308, as described above with respect to FIG. 2B, to produce interleaved data. The interleaved data may be stored to memory or non-volatile storage, or it may be transmitted via a channel. In some examples, the interleaved data may be stored or used in the computing environments shown in FIGS. 8A-8G.

FIG. 3B shows a flow chart of a corresponding method for producing an interleaved codeword. The disclosed technology can encode data using an RLL code to produce RLL-encoded data at block 350. A copy of the RLL-encoded data can be stored in a buffer at block 352. The RLL-encoded data can also be encoded based on an error correction code to provide parity information at block 354. The parity information and the and RLL-encoded data in the buffer can be interleaved to produce an interleaved codeword at block 356.

Figure 4A:
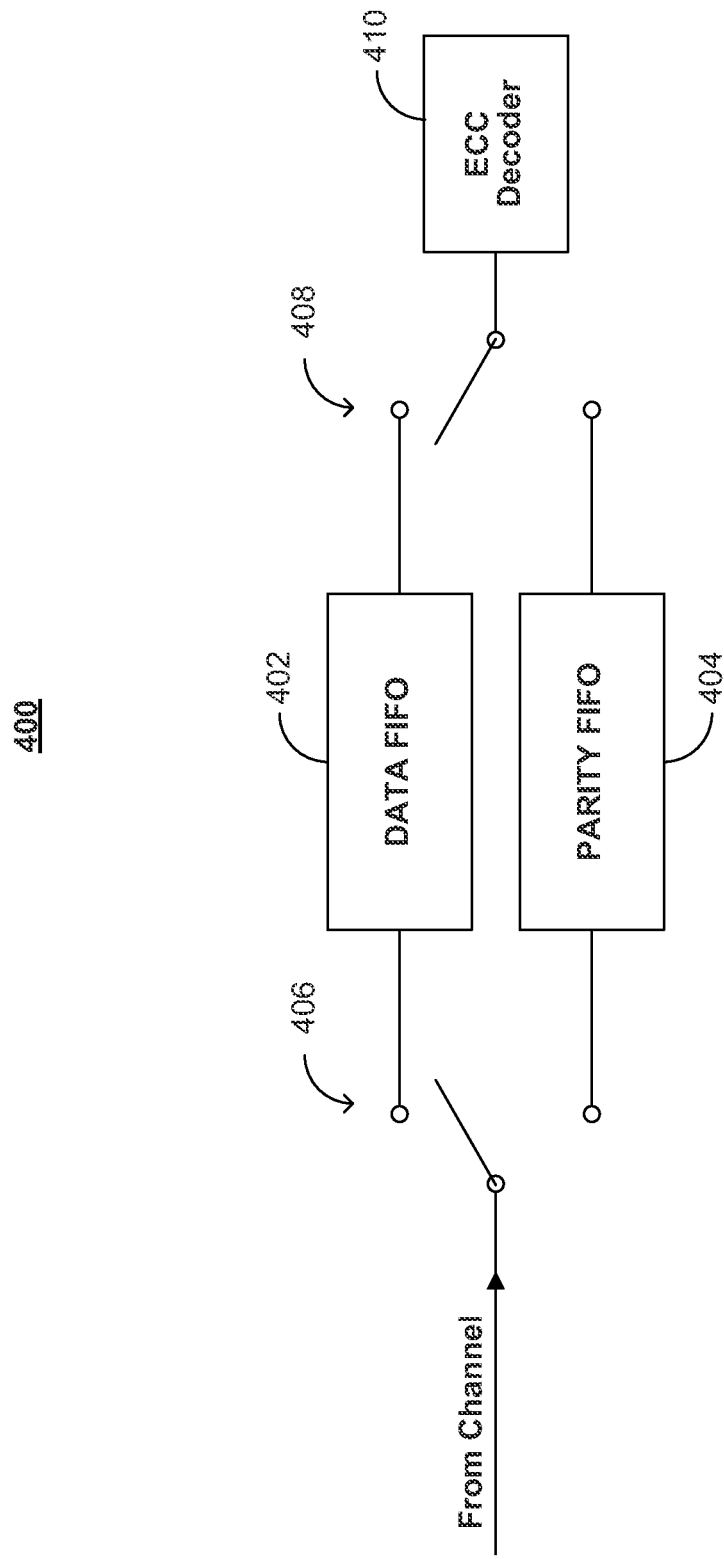
FIG. 4A is a block diagram of an exemplary system for decoding an interleaved codeword in accordance with one aspect of the invention.
Figure 4B:
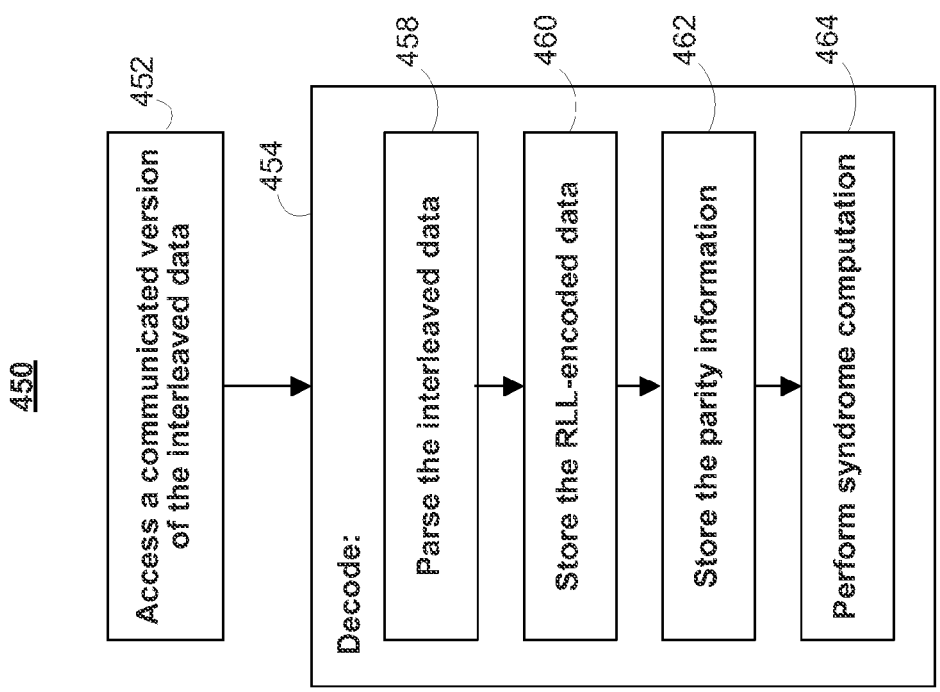
FIG. 4B is a flow diagram of an exemplary method of decoding an interleaved Reed-Solomon codeword.

FIGS. 4A and 4B are diagrams of a system 400 and a corresponding method 450 for decoding data in accordance with one aspect of the invention. Referring to FIG. 4A, the illustrated system 400 receives a communicated or stored version of interleaved data, such as the interleaved data produced by the multiplexer 310 of FIG. 3A, and de-interleaves the data to produce an ECC codeword. An ECC decoder then receives and decodes the ECC codeword. The de-interleaving can be performed by a de-multiplexer 406, which is shown in FIG. 4A as the left switch. The de-multiplexer 406 can know the format of the interleaved data and can communicate the RLL-encoded symbols to a data memory 402 and communicate the parity symbols to a parity memory 404. The memories 402 and 404 may be First-In-First-Out (FIFO) buffers. In the case of Reed-Solomon codes, the buffers 402 and 404 may be sized to hold about 2t symbols. In one example, the parity buffer 404 can be sized to hold about 2t symbols, while the data buffer 402 can be sized to hold about i symbols (where i is the period of interleaving). A multiplexer 408, shown in FIG. 4A as the right switch, can then combine the RLL-encoded data with the parity data to produce an ECC codeword. The ECC codeword may be forwarded to an ECC decoder 410. In another embodiment, the system 400 does not include a data FIFO 402. In this embodiment, incoming data symbols are sent directly to the ECC decoder 410, while the parity symbols are stored in the parity FIFO 404.

Referring now to FIG. 4B, the disclosed technology can receive a stored and/or communicated version of interleaved data at block 452. The interleaved data can be decoded at block 454 by first parsing the interleaved data into RLL-encoded data and parity information data at block 458. The RLL-encoded data can be stored in a data buffer at block 460, and the parity information data can be stored in a parity buffer at block 462. In the case of Reed-Solomon codes, decoding can begin by computing syndromes based on the RLL-encoded data and the parity information at block 464.

In one aspect of the invention, as the interleaved data is being stored in the buffers at blocks 460 and 462, ECC decoding may begin and can occur simultaneously at block 464. In one example, the error correction code is a Reed-Solomon code, and the ECC decoding includes syndrome computation. FIG. 5 shows an exemplary timing diagram 500 for syndrome computation and decoding of the input data of FIG. 4A. The timing diagram begins at point 502 and advances to point 510 as time progresses. FIG. 5 shows timing for processing first 512 and second 514 sectors of input data, including processing the separated data buffer symbols (k symbols) and parity buffer symbols (n−k=2t symbols). With reference also to FIG. 4A, starting at time 502 in FIG. 5, data is received and stored in the data and parity buffers 402, 404. After 2t clock cycles, at time 504, neither of the buffers 402, 404 will be full, since at least one input symbol (e.g. the first input symbol) will have been a parity information symbol, and thus stored in the parity buffer 404, and at least one input symbol will have been a data symbol and thus stored in the data buffer 402.

However, after 2t clock cycles, at point 504, syndrome computation begins on the data symbols of the data buffer 402. While syndrome computation is performed on the data in the data buffer 402, data symbols and parity symbols from the first sector 512 continue to be parsed and input into the appropriate buffer 402 or 404. The output rate from the data buffer 402 to syndrome computation may be smaller than the input rate to the data buffer 402, since some of the interleaved data will be stored in the parity buffer 404. In this embodiment, because there are 2t parity symbols in each block of interleaved data, and 2t symbols have already been processed and input to the buffers 402 and 404, the data buffer 402 will not be empty before all the input data symbols have been stored in the data buffer 402 despite the input rate being smaller than the output rate. However, if the data buffer 402 is empty at any point in time, the syndrome computation may be suspended until more data symbols are entered.

Once syndrome computation has been performed on the data symbols in the data buffer 402 corresponding to the first sector 512, the entire first sector has been input to the buffers 402 and 404, and thus all the parity symbols of the first sector 512 will have been input to the parity buffer 404. At this point 506, syndrome computation begins on the parity symbols of the parity buffer 404.

While syndrome computation is completed on the parity symbols of the first sector 512 (during the time between points 506 and 508), data symbols and parity symbols of the second sector 514 are input into the respective buffers 402 and 404. After 2t clock cycles (at point 508), syndrome computation of the first sector 512 is complete, and syndrome computation for the data symbols of the second sector 514 begins. The second sector 514 continues to be input into the buffers 402 and 404. At point 510, the entire second sector 514 has been input, syndrome computation of the data symbols is complete, and syndrome computation of the parity symbols begins. According to this embodiment, data input and syndrome computation occur simultaneously, and there is no inactive period while one process waits for the other.

Figure 6A:
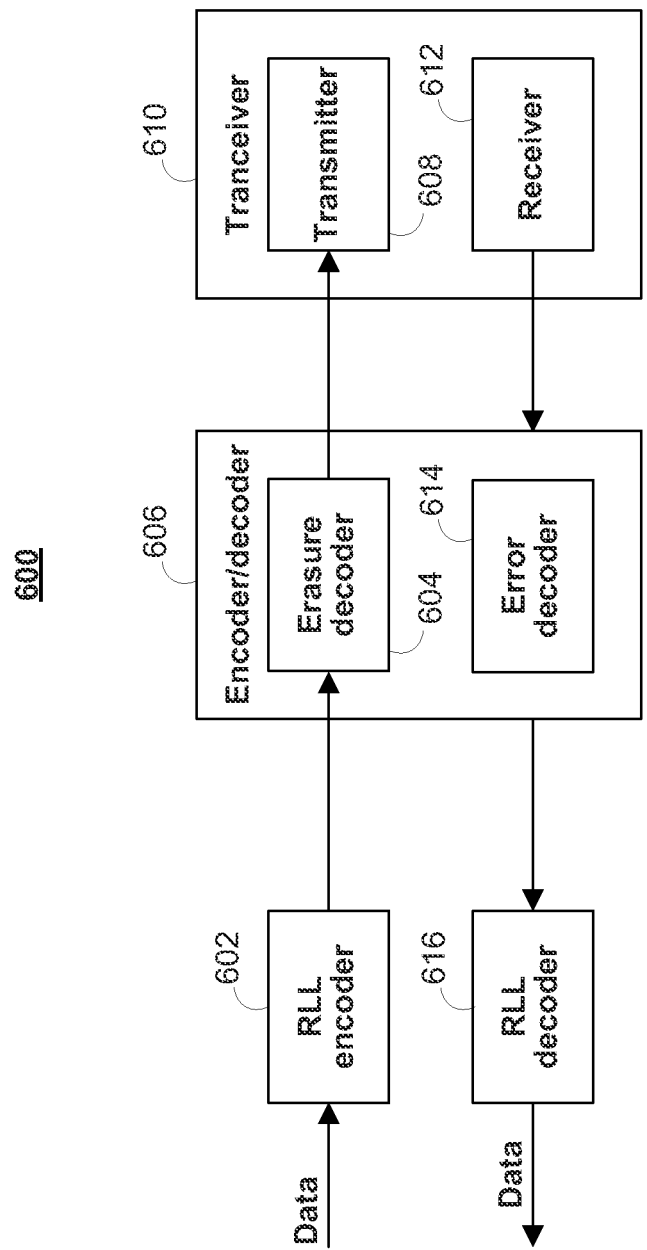
FIG. 6A is a block diagram of another exemplary system for producing the interleaved codeword of FIG. 2B.
Figure 6B:
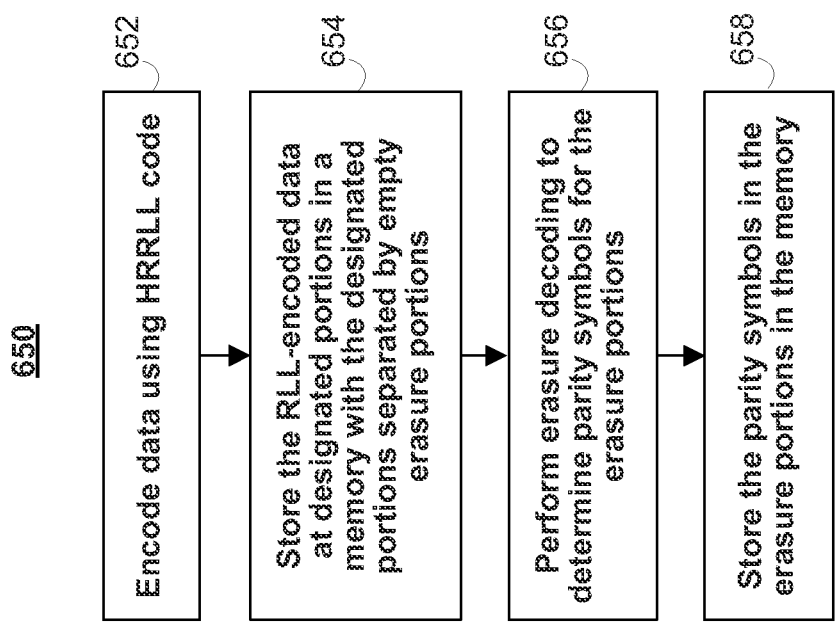
FIG. 6B is a flow diagram of another exemplary method for producing the interleaved codeword of FIG. 2B.

Referring now to FIGS. 6A and 6B, diagrams of another exemplary system 600 and another exemplary method 650 for producing interleaved data are shown, in accordance with another aspect of the invention. Referring to FIG. 6A, data is first sent to a RLL-encoder 602, where it is encoded using a RLL code. In one embodiment, the RLL code is a "high rate" RLL code. The meaning of "high rate" may vary with different applications. The RLL-encoded data can be stored at designated portions of a memory (not shown), with the designated portions separated by empty erasure portions. These empty portions correspond to the locations where parity information can be stored. However, rather than producing the parity information using an ECC encoder, in one aspect of the invention, the parity information is produced using an erasure decoder. Erasure decoding is typically used during decoding to assign values to erasures or unknowns at various data locations. By using erasure decoding at the encoder/decoder 606 to compute values at the erasure portions, the parity symbols automatically become interleaved within the RLL-encoded data. The interleaved data is output from the decoder 604 to the transmitter 608 of a transceiver 610. The transceiver 610 can be a device for communicating information to and from a channel, or can be a device for storing and reading information from a storage medium, such as a disk drive write head and read head. In one embodiment, the output data having the interleaved parity symbols can be a Reed-Solomon codeword.

According to one aspect of the invention, the transceiver 610 also includes a receiver 612 for receiving interleaved data. The received data can be sent to the encoder/decoder 606 for decoding. Decoding may include detecting and amending errors as well as erasures in the received data. According to the illustrative example, errors are decoded at the error decoder 614, while erasures are decoded at the erasure decoder 604. The decoded data is then sent to an RLL decoder 616 for RLL-decoding. Therefore, in the illustrated embodiment of FIG. 6A, the encoding and decoding paths both share the same erasure decoder block 604. The erasure decoder 604 is used in place of an ECC encoder.

FIG. 6B shows an exemplary method for using erasure decoding to produce interleaved data, in accordance with one aspect of the invention. The disclosed technology can encode data based on an RLL code to produce RLL-encoded data at block 652. The RLL-encoded data can be stored in memory. In particular, the RLL-encoded data can be stored in designated portions of a memory that are separated by empty "erasure" portions at block 654. Erasure decoding can be performed on the RLL-encoded data in the memory to compute values for the erasure portions at block 656. The computed values are parity symbols. These parity symbols can then be stored in the erasure portions of the memory to form an interleaved codeword at block 658.

Figure 7:
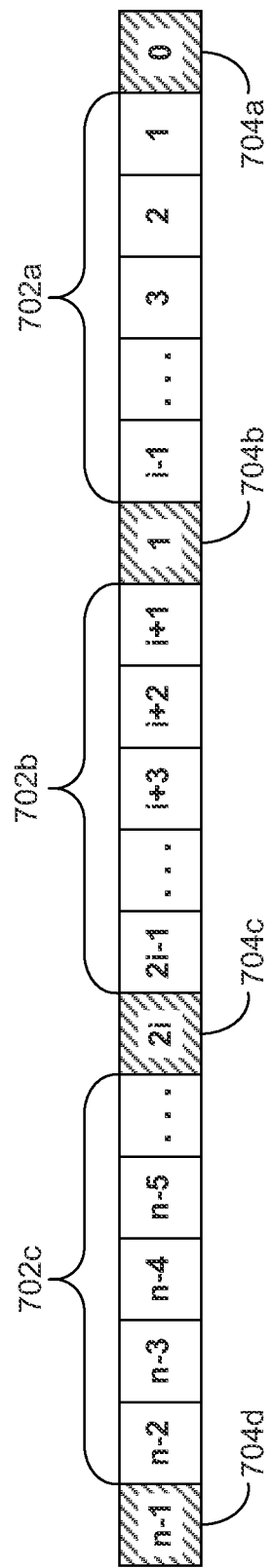
FIG. 7 is a block diagram illustrating an exemplary interleaved codeword in which parity data locations are designated as erasures.

FIG. 7 is a block diagram illustrating an exemplary interleaved codeword 700 produced using erasure decoding. The codeword 700 includes data portions 702a-702c, and erasures 704a-704d. The data portion 702a-702c may be substantially the same as the data portions 222a-222d of FIG. 2B. The erasures 704a-704d can initially be empty, or can be set to a default value. However, after erasure decoding and calculation of parity information for the empty portions, the erasures 704a-704d are replaced with parity symbols.

Accordingly, what have been described thus far are systems and methods for encoding and decoding data using a RLL code and an ECC code, and based on parity interleaving. The components of the illustrated figures can be implemented using digital hardware, analog hardware, and/or a processor architecture with programmable instructions.

The proposed interleaving scheme can also be applied to other concatenated coding systems, as long as the second encoder is a systematic encoder. For example, the first encoder may be a convolutional encoder, or block encoder. In another example, the second encoder may be a BCH encoder. According to one embodiment, the same interleaving idea described with respect to FIGS. 2B and 3A will hold when the second encoder is a systematic encoder.

In some embodiments, a first portion of the data is RLL encoded and a second portion of the data is not RLL encoded. The first and second portions of the data may be stored in a buffer. The first and second portions of the data may be ECC encoded to provide parity information. In one embodiment, the stored second portion and the parity information are interleaved with the stored first portion to provide interleaved data. In another embodiment, the stored first portion is segmented into first and second sections. The second section of the stored first portion, the stored second portion, and parity information may then all be interleaved with the first section of the stored first portion.

Referring now to FIGS. 8A-8G, various exemplary implementations of the present invention are shown.

Figure 8A:
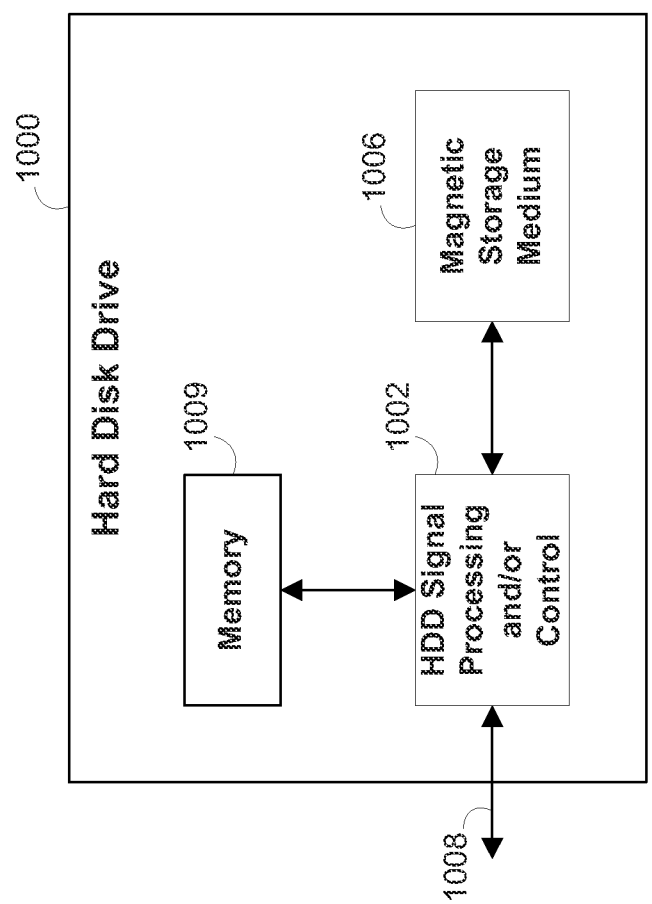
FIG. 8A is a block diagram of an exemplary hard disk drive that can employ the disclosed technology.

Referring now to FIG. 8A, the present invention can be implemented in a hard disk drive 1000. The present invention may implement either or both signal processing and/or control circuits, which are generally identified in FIG. 8A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 8B:
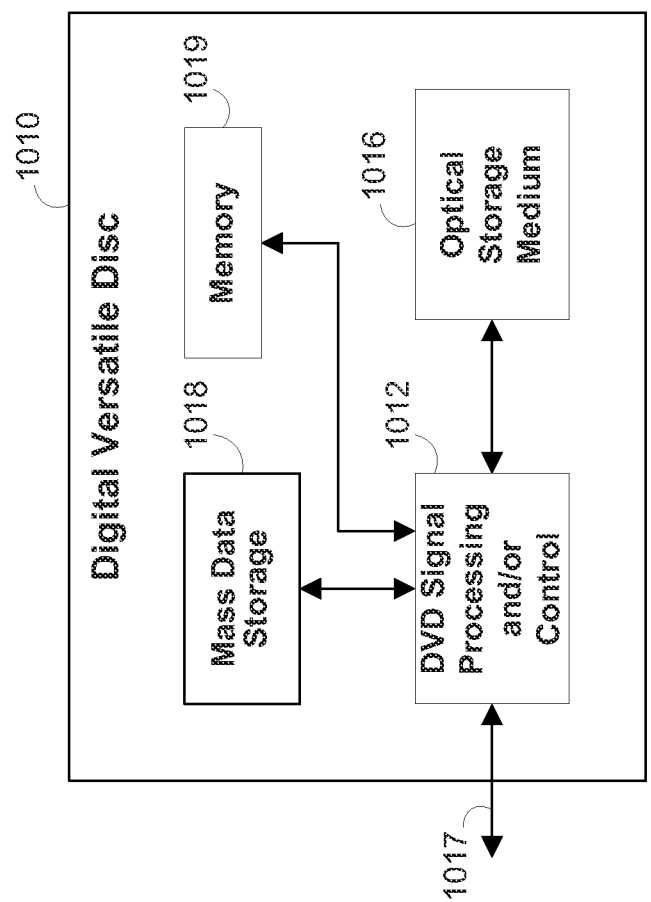
FIG. 8B is a block diagram of an exemplary digital versatile disc that can employ the disclosed technology.

Referring now to FIG. 8B, the present invention can be implemented in a digital versatile disc (DVD) drive 1010. The present invention may implement either or both signal processing and/or control circuits, which are generally identified in FIG. 8B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 8A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 8C:
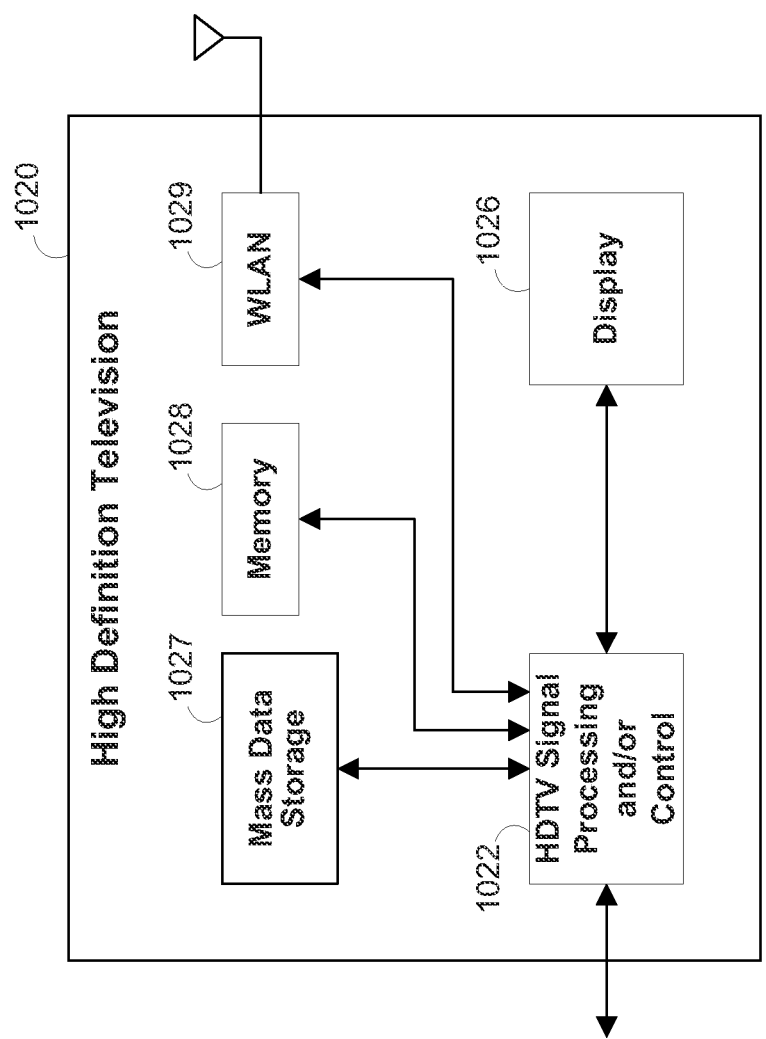
FIG. 8C is a block diagram of an exemplary high definition television that can employ the disclosed technology.

Referring now to FIG. 8C, the present invention can be implemented in a high definition television (HDTV) 1020. The present invention may implement either or both signal processing and/or control circuits, which are generally identified in FIG. 8C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 8A and/or at least one DVD may have the configuration shown in FIG. 8B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 8D:
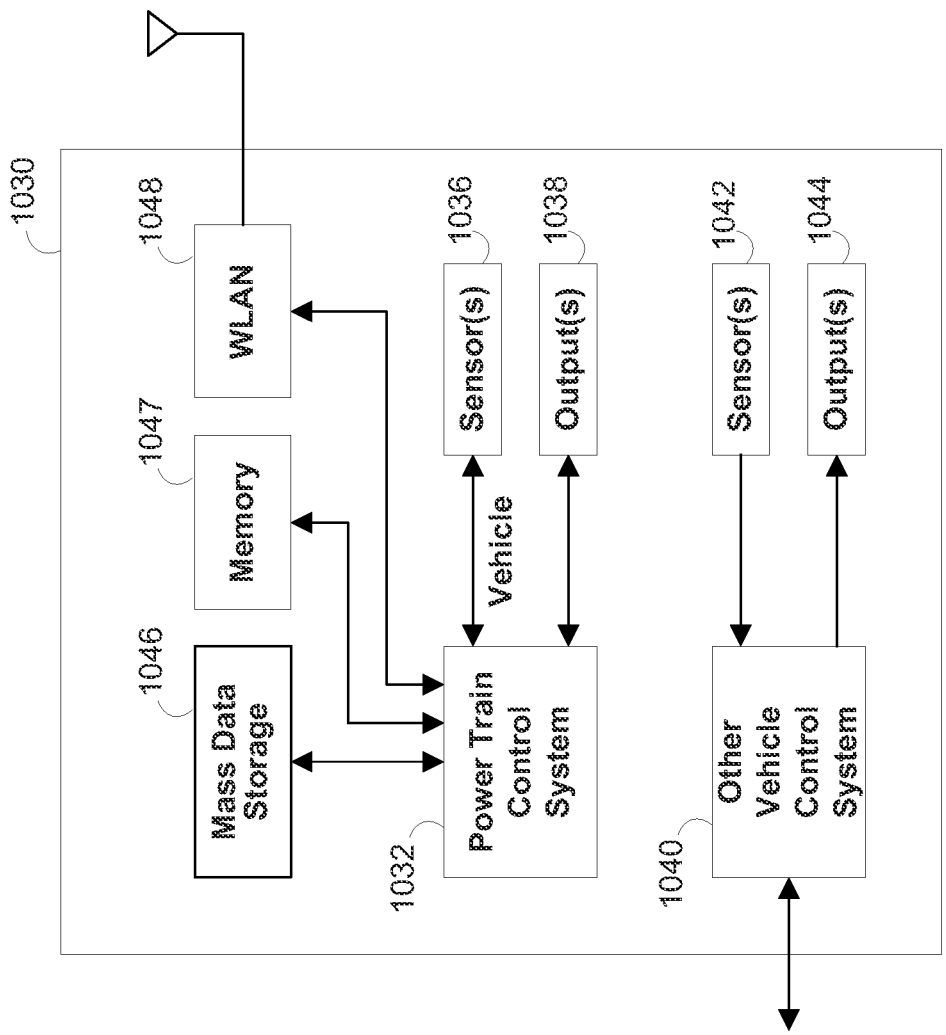
FIG. 8D is a block diagram of an exemplary vehicle that can employ the disclosed technology.

Referring now to FIG. 8D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 8E:
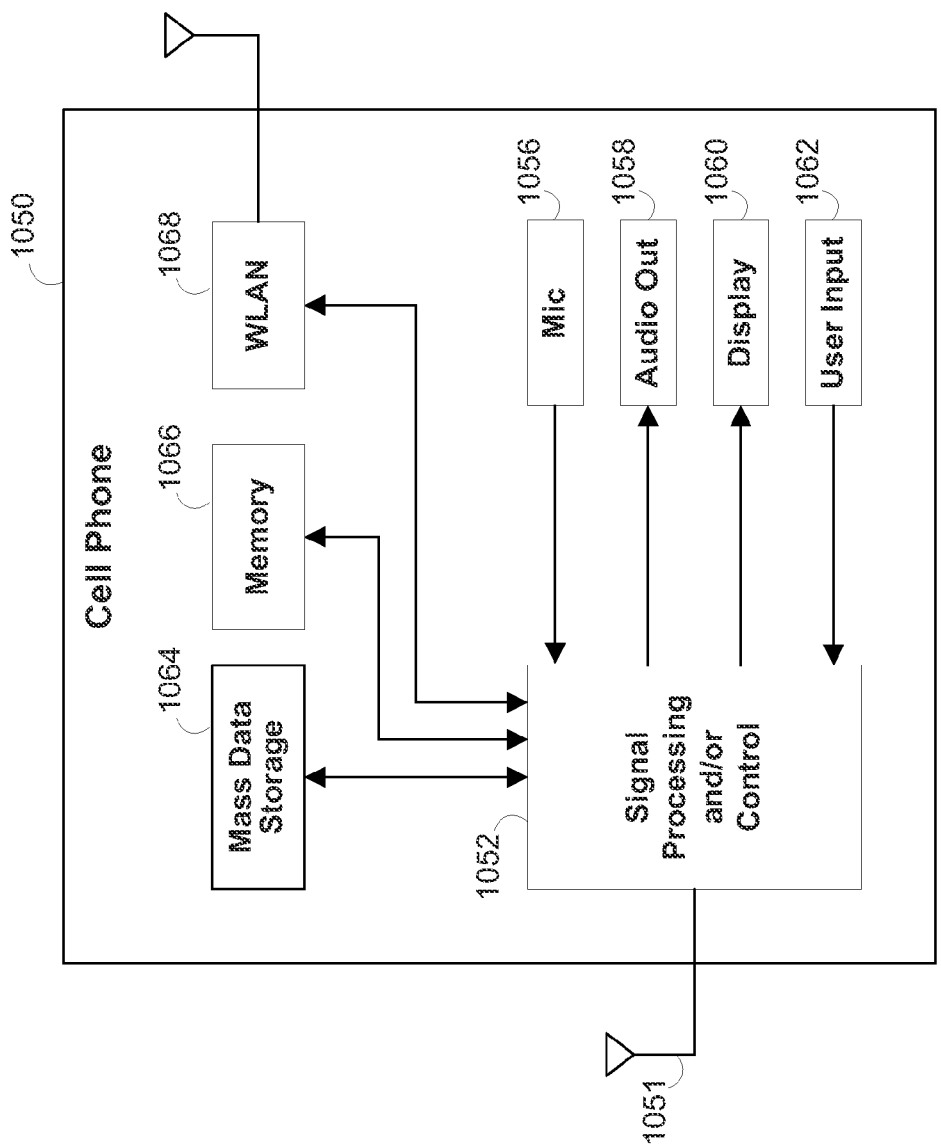
FIG. 8E is a block diagram of an exemplary cell phone that can employ the disclosed technology.

Referring now to FIG. 8E, the present invention can be implemented in a cellular phone 1050 that may include a cellular antenna 1051. The present invention may implement either or both signal processing and/or control circuits, which are generally identified in FIG. 8E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 8F:
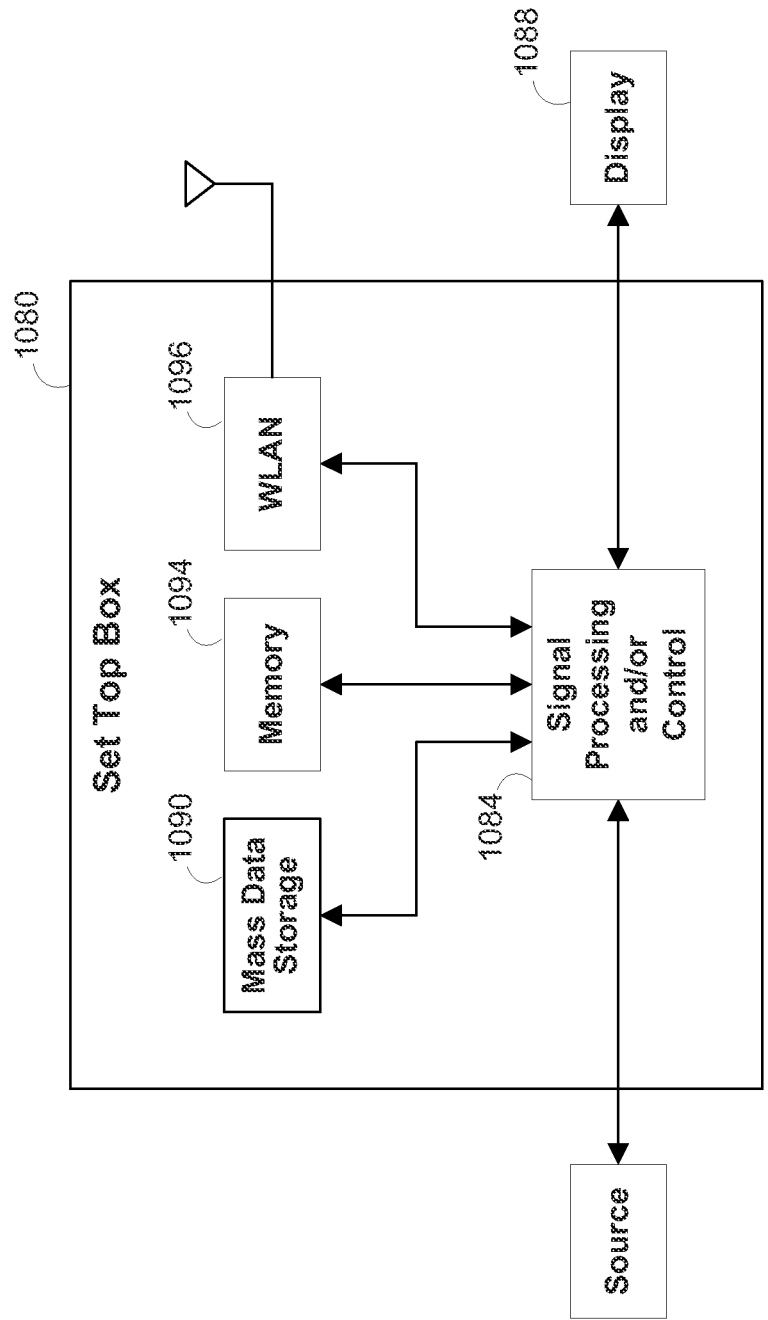
FIG. 8F is a block diagram of an exemplary set top box that can employ the disclosed technology.

Referring now to FIG. 8F, the present invention can be implemented in a set top box 1080. The present invention may implement either or both signal processing and/or control circuits, which are generally identified in FIG. 8F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 8G:
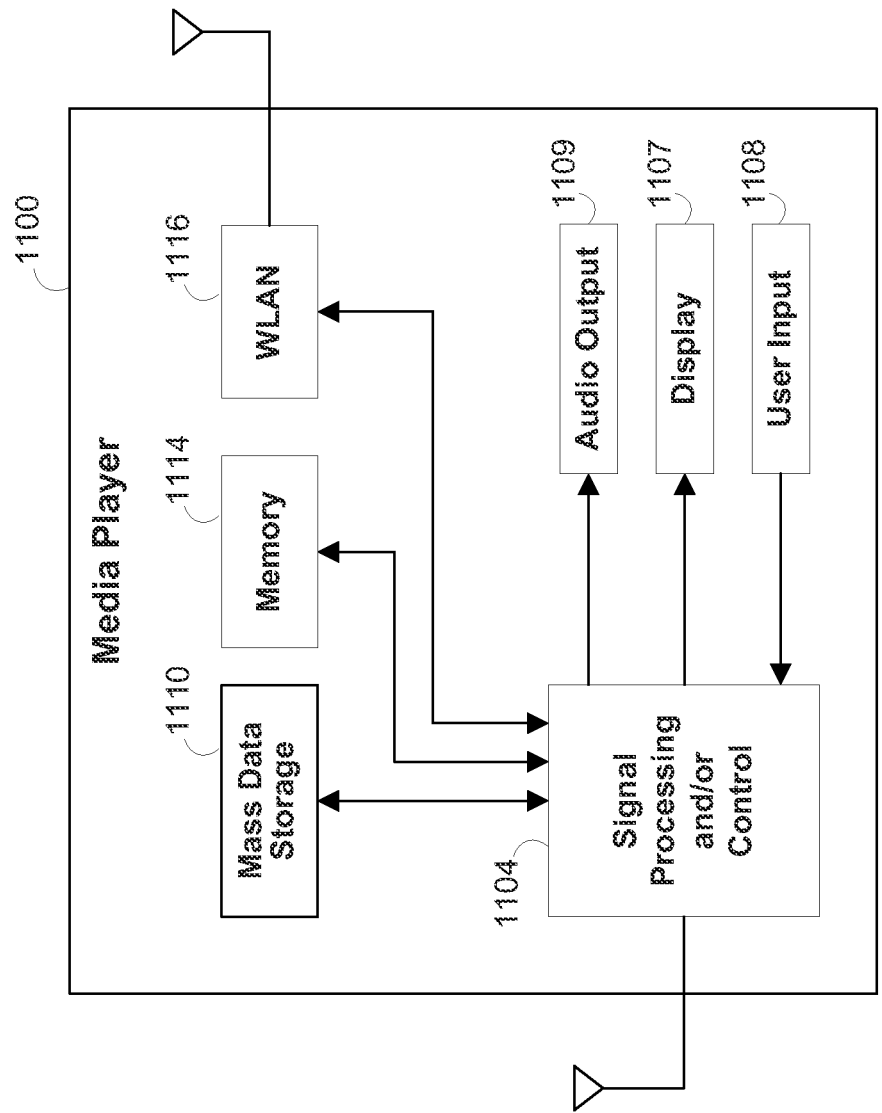
FIG. 8G is a block diagram of an exemplary media player that can employ the disclosed technology.

Referring now to FIG. 8G, the present invention can be implemented in a media player 1100. The present invention may implement either or both signal processing and/or control circuits, which are generally identified in FIG. 8G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Accordingly, what have been described are systems and methods for encoding and decoding data based on a RLL code and/or an ECC code, and based on parity interleaving. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed invention as defined by the following claims.

What is claimed is:

1. A method for encoding data, the method comprising:
    encoding data, using encoder circuitry, based on a run length limited (RLL) code to generate RLL-encoded data;
    performing erasure decoding on the RLL-encoded data to determine at least one parity symbol corresponding to the RLL-encoded data; and
    interleaving the RLL-encoded data with the at least one parity symbol determined from the erasure decoding to provide interleaved encoded data.

2. The method of claim 1, wherein the interleaving comprises generating a codeword by:
    setting a first and second portions of the codeword to at least part of the RLL-encoded data; and
    setting a third portion of the codeword to the at least one parity symbol determined from the erasure decoding, wherein the third portion of the codeword is positioned between the first and second portions of the codeword.

3. The method of claim 1, comprising:
    marking a portion of the interleaved encoded data as an erasure portion; and
    in response to the determining the at least one parity symbol from the erasure decoding, setting the marked erasure portion to the at least one determined parity symbol.

4. The method of claim 1, wherein the RLL code is a high rate RLL code.

5. The method of claim 1, wherein the interleaved encoded data is DC-free.

6. A system for encoding data, the system comprising:
    encoding circuitry configured for encoding data based on a run length limited (RLL) code to generate RLL-encoded data;
    decoding circuitry configured for performing erasure decoding on the RLL-encoded data to determine at least one parity symbol corresponding to the RLL-encoded data; and
    interleaving circuitry configured for providing interleaved encoded data, the interleaved encoded data comprising the RLL-encoded data interleaved with the at least one parity symbol determined from the erasure decoding.

7. The system of claim 6, wherein the interleaving circuitry comprises circuitry configured for generating a codeword by:
    setting a first and second portions of the codeword to at least part of the RLL-encoded data; and
    setting a third portion of the codeword to the at least one parity symbol determined from the erasure decoding, wherein the third portion of the codeword is positioned between the first and second portions of the codeword.

8. The system of claim 6, wherein the interleaving circuitry comprises circuitry configured for:
    marking a portion of the interleaved encoded data as an erasure portion; and
    in response to the determining the at least one parity symbol from the erasure decoding, setting the marked erasure portion to the at least one determined parity symbol.

9. The system of claim 6, wherein is the interleaved encoded data comprises at least one Reed-Solomon codeword.

10. The system of claim 6, wherein the RLL code is a high rate RLL code.

11. The system of claim 6, wherein the interleaved encoded data is DC-free.

12. The system of claim 6, wherein the interleaving circuitry comprises a memory configured for storing the interleaved encoded data.

13. The system of claim 6, wherein the system is comprised in a transceiver.

14. A system for encoding data, the system comprising:
    means for encoding data based on a run length limited (RLL) code to generate RLL-encoded data;
    means for performing erasure decoding on the RLL-encoded data to determine at least one parity symbol corresponding to the RLL-encoded data; and
    means for interleaving the RLL-encoded data with the at least one parity symbol determined from the erasure decoding to provide interleaved encoded data.

15. The system of claim 14, wherein the means for interleaving comprises means for generating a codeword by:
    setting a first and second portions of the codeword to at least part of the RLL-encoded data; and
    setting a third portion of the codeword to the at least one parity symbol determined from the erasure decoding, wherein the third portion of the codeword is positioned between the first and second portions of the codeword.

16. The system of claim 14, wherein the means for interleaving comprises:
    means for marking a portion of the interleaved encoded data as an erasure portion; and means in response to the determining the at least one parity symbol from the erasure decoding, setting the marked erasure portion to the at least one determined parity symbol.

17. The system of claim 14, wherein is the interleaved encoded data comprises at least one Reed-Solomon codeword.

18. The system of claim 14, wherein the RLL code is a high rate RLL code.

19. The system of claim 14, wherein the interleaved encoded data is DC-free.

20. The system of claim 14, wherein the means for interleaving comprises means for storing the interleaved encoded data.

* * * * *